United States Patent [19]
Pham et al.

[11] Patent Number: 5,998,301
[45] Date of Patent: Dec. 7, 1999

[54] METHOD AND SYSTEM FOR PROVIDING TAPERED SHALLOW TRENCH ISOLATION STRUCTURE PROFILE

[75] Inventors: Tuan D. Pham, Santa Clara; Angela T. Hui; Kashmir Sahota, both of Fremont, all of Calif.

[73] Assignee: Advanced Micro Devices, Inc., Sunnyvale, Calif.

[21] Appl. No.: 08/993,252

[22] Filed: Dec. 18, 1997

[51] Int. Cl.⁶ .................................................. H01L 21/308
[52] U.S. Cl. ........................... 438/701; 438/700; 438/719; 438/690; 438/710; 438/691; 438/692
[58] Field of Search ..................... 438/700, 701, 438/719, 690, 710, 691, 692

[56] References Cited

U.S. PATENT DOCUMENTS

| | | | |
|---|---|---|---|
| 3,769,109 | 10/1973 | MacRae et al. | 156/3 |
| 4,693,781 | 9/1987 | Leung et al. | 156/643 |
| 4,729,815 | 3/1988 | Leung . | |
| 4,778,583 | 10/1988 | Wagner et al. | 204/192.37 |
| 4,839,306 | 6/1989 | Wakamasu | 437/67 |
| 4,855,017 | 8/1989 | Douglas | 156/643 |
| 4,885,054 | 12/1989 | Shibagasky | 156/643 |
| 4,938,841 | 7/1990 | Shahar et al. | 156/661.1 |
| 5,030,316 | 7/1991 | Motoyama et al. | 156/626 |
| 5,254,218 | 10/1993 | Robert et al. | 156/662 |
| 5,656,821 | 8/1997 | Sakuma | 257/14 |

FOREIGN PATENT DOCUMENTS

| | | |
|---|---|---|
| 375632A2 | 6/1990 | United Kingdom . |
| 696059A2 | 2/1996 | United Kingdom . |

OTHER PUBLICATIONS

Stanley Wolf and Richard Tauber "Silicon Processing for the VLSI era" vol 1, pp 357–358, 1986.

*Primary Examiner*—Benjamin Utech
*Assistant Examiner*—Lan Vinh
*Attorney, Agent, or Firm*—Sawyer & Associates

[57] ABSTRACT

A method and system for providing a shallow trench isolation structure profile on a semiconductor is disclosed. The method and system includes patterning a mask on the semiconductor substrate, etching the mask such that the mask has sloped sides, etching the semiconductor substrate to form a trench whereby the trench has tapered sides, and planarizing the semiconductor substrate to optimize the trench depth and the width of the trench opening for subsequent processes. According to the method and system disclosed herein, the present invention allows a shallow trench isolation structure profile to be formed which has tapered sides.

12 Claims, 5 Drawing Sheets

METHOD AND SYSTEM FOR PROVIDING TAPERED SHALLOW TRENCH ISOLATION STRUCTURE PROFILE

FIELD OF THE INVENTION

The present invention relates to semiconductor processing and more particularly to a method and system for providing a tapered shallow trench isolation profile in a semiconductor device.

BACKGROUND OF THE INVENTION

As dimensions of semiconductor devices shrink, isolation techniques have had to move from conventional local oxidation of silicon ("LOCOS") isolation techniques to shallow trench isolation ("STI").

In fabricating an STI structure, a trench is created in a substrate. The trench marks an end of the active area of the device to be fabricated. Under the current state of the art, the walls of the trench created are very close to being perpendicular with the surface of the substrate. The perpendicular nature of the walls leads to several problems in the fabrication of the remainder of the semiconductor device.

One problem occurs during the implantation of a connecting layer, for example a layer of N+ ions, into the substrate after the creation of the trench and the filling of the trench with field oxide. The connecting layer of N+ ions will connect metal later formed on the substrate outside of the trench which will make up the circuits of the connected devices. Because the walls of the trench are very close to perpendicular and the implant direction is also close to perpendicular, the N+ ions do not implant into the walls of the trench. Also, the depth of the close-to-perpendicular trench might not be optimized for the implant to reach the bottom of the trench. This creates gaps in the connecting layer which would cause an open circuit, preventing the connectivity of the circuits.

A second problem is associated with the active areas in the upper corners of the trench. After the trench is created, it is filled with field oxide. Then the wafer is planarized using chemical-mechanical polishing (CMP). A thin layer of tunnel oxide is grown on the substrate. However, due to the abrupt drop-off of the trench walls and subsequent processes, the field oxide around the edges of the gate and near the trench could become recessed. This could cause the tunnel oxide in this area to thin or become damaged. This creates a layer of tunnel oxide which is of uneven thickness, causing undesirable variances in the electric field generated throughout the tunnel oxide during programming and/or erasing operations. This compromises the reliability of the device.

The corners at the upper portion of the trench are known high stress points which, during an oxidation cycle, can inhibit the formation of a good quality oxide. The lack of a good quality gate oxide adversely affects device performance and reliability.

A third problem is the device's vulnerability to a misalignment of the mask used to form metal contacts, due to the perpendicular nature of the walls of the trench. The mask is created by etching a layer of interlayer dielectric which has been deposited on the p-type substrate and the trench area. In an aligned situation, the etch exposes portions of the substrate at which metal contacts will be formed, while protecting the trench area. No portion of the trench area is etched. But in a misaligned situation, the etch does occur at least at a portion of the trench area. Since the etch continues until substrate is reached, a portion of the field oxide inside the trench can be etched away along with the interlayer dielectric above it. This exposes a wall of the trench. When the metal contact material is laid to plug the holes in the mask, it will touch the wall of the trench. Since there are gaps in the connecting layer along the trench walls, as explained above, the metal contact material is directly touching the substrate, causing a short to substrate.

Accordingly, what is needed is a method for providing an STI structure profile which will prevent gaps in the connecting layer, prevent oxide film erosion during the various steps in the processing sequence to protect the stressed upper corners of the trench, and prevent a short to substrate in the event of a misalignment of the mask during metal contact formation.

SUMMARY OF THE INVENTION

A method and system in accordance with the present invention provides for a shallow trench isolation structure profile on a semiconductor. The method and system includes patterning a mask on the semiconductor substrate, etching the mask such that the mask has sloped sides, etching the semiconductor substrate to form a trench whereby the trench has tapered sides, and planarizing the semiconductor substrate to optimize the trench depth and the width of the trench opening for subsequent processes. According to the method and system disclosed herein, the present invention allows a shallow trench isolation structure profile to be formed which has tapered sides.

DETAILED DESCRIPTION OF THE INVENTION

The present invention relates to an improvement in semiconductor processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
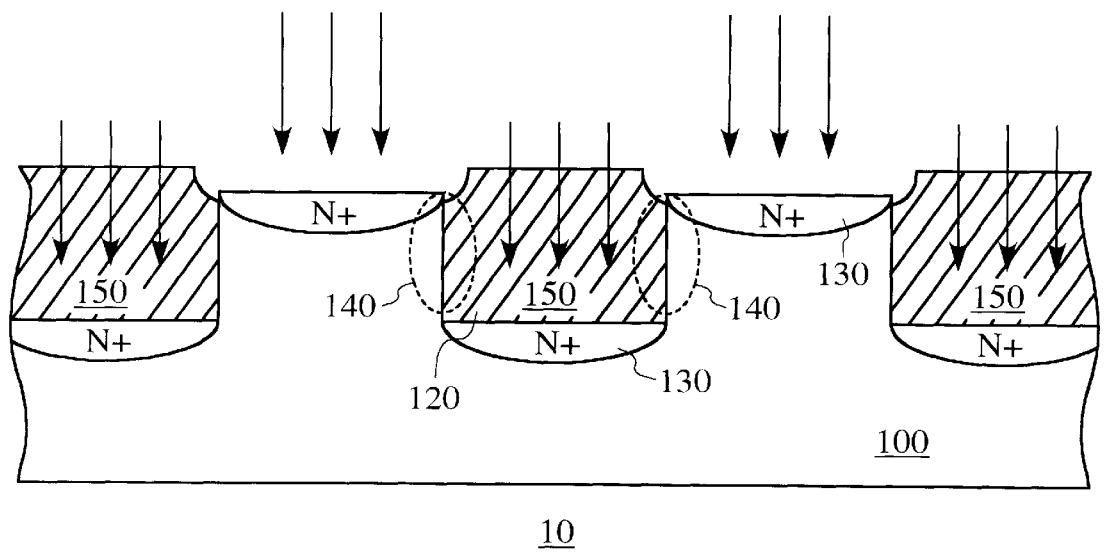
FIG. 1 is a diagram of a semiconductor device where a connecting implant species, for example N+ ions, are implanted into the substrate after formation of a conventional STI structure profile.

FIG. 1 is a diagram of a semiconductor device 10 where a connecting implant species, for example N+ ions, are implanted into the substrate 100 after the formation of a conventional STI structure profile 120 and the filling of the structure with field oxide 150. A connecting layer of N+ ions 130 forms in the substrate 100. This layer 130 will eventually connect the metal contacts, to be formed later, which will make up the circuits of the many devices. However, gaps 140 in this layer in the walls of the trench result because the walls are nearly perpendicular to the surface of the substrate while the direction of the implant is also nearly perpendicular. This prevents the implant species from entering the walls of the trench. Also, the depth of the close-to-perpendicular trench might not be optimized for the implant to reach the bottom of the trench. These gaps 140 will prevent the connectivity of the circuits.

Figure 2:
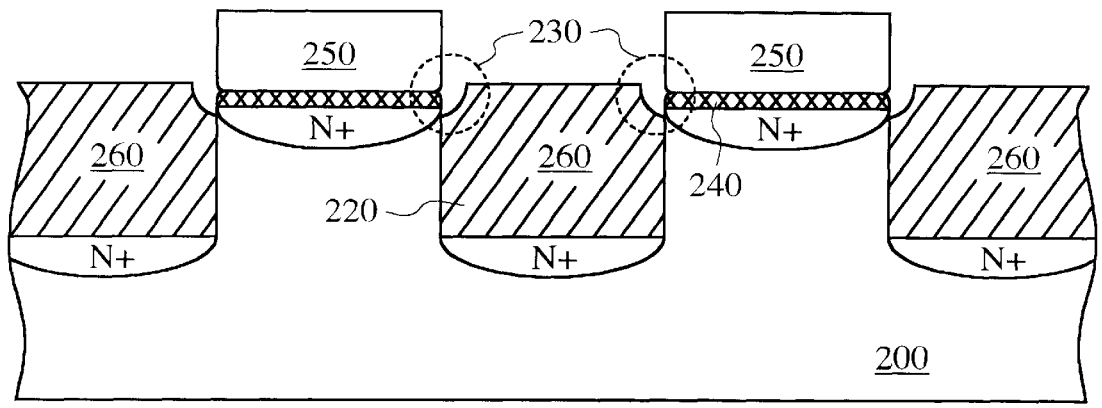
FIG. 2 is a diagram of a semiconductor device after formation of a conventional STI structure profile, with exposed active areas at the upper corners of the trench.

FIG. 2 is a diagram of a semiconductor device 20 after formation of a conventional STI structure profile 220, with a thinning of the tunnel oxide 240 at the upper corners of the trench. In the preferred embodiment, the semiconductor device 20 is a FLASH EEPROM. The poly-I 250 is the floating gate, and in many applications, the erasing and/or programming of the device is done near the edges of the tunnel oxide 240 in the active areas at the upper comers of the trench, indicated by the dotted circles 230. The perpendicular nature or the sharp drop-off of the walls of the trench could cause the field oxide 260 to recede at the upper comers 230 during processing of the device. The exposure can cause the edge of the tunnel oxide 240 to thin or become damaged. This makes it much more difficult to effectuate a good erasure or programming of the device, thus seriously compromising the reliability of the device. Although this problem is disclosed in the context of a FLASH EEPROM, a person of ordinary skill in the art will understand that other similar problems can occur in other types of semiconductor devices.

Figure 3A:
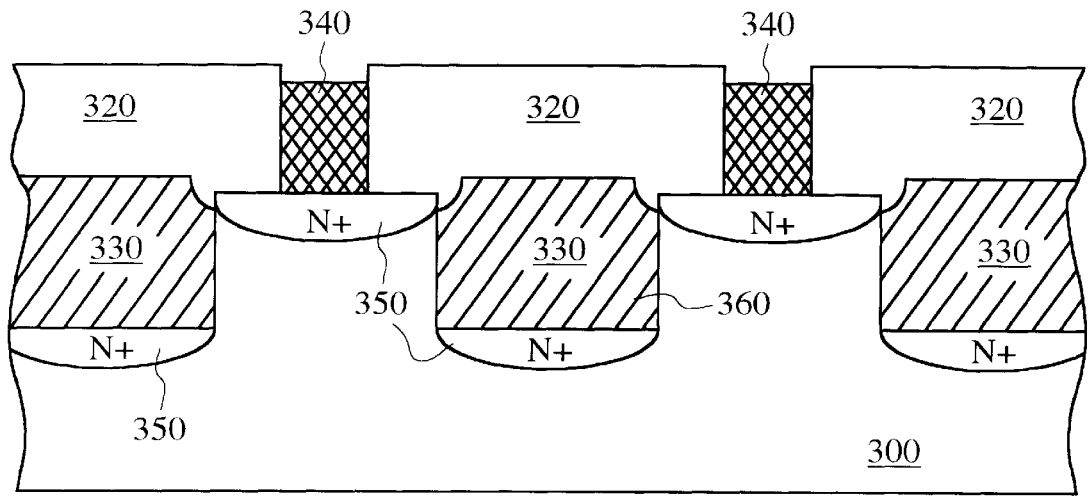
FIG. 3A is a diagram of a semiconductor device with a conventional STI structure profile during the metal contacts formation process where the mask is aligned.
Figure 3B:
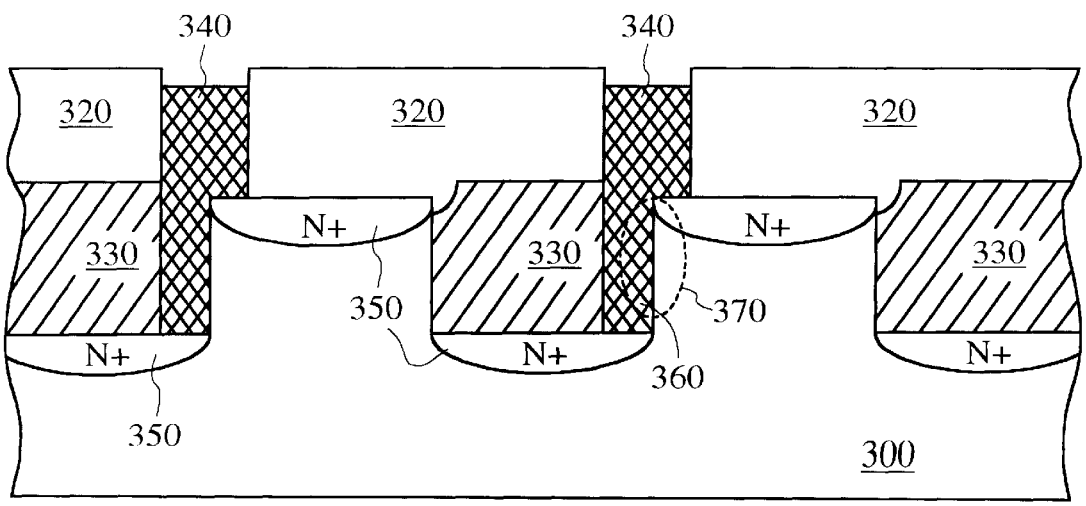
FIG. 3B is a diagram of a semiconductor device with a conventional STI structure during the metal contacts formation process where the mask is misaligned.

FIG. 3A–3B are diagrams of a semiconductor device 30 with a conventional STI structure profile during the metal contact formation process. In forming the circuits of the many devices, for example by forming metal contacts, first an interlayer dielectric ("ILD") 320 is laid on the p-type substrate 300 and trench area. The ILD 320 is then polished and etched to substrate 300 to form openings. Metal contact material 340, typically Tungsten, will then be placed to plug these openings. The metal contact material 340 then should be in direct contact with the N+ layer 350 in the substrate. This N+ layer 350 electrically connects the metal contacts 340. However, the mask occasionally misaligns during normal processing.

FIG. 3A shows a semiconductor device 30 with a conventional STI structure profile during the metal contact formation process where the mask is aligned. The ILD mask 320 completely protects the trench area 360 from the metal contact material 340. FIG. 3B shows a semiconductor device 30 with a conventional STI structure profile during the metal contact formation process where the mask is misaligned. In a misalignment, the etching of the ILD 320 includes the etching away of a part of the field oxide 330 in the trench 360. The etch could continue until it reaches substrate 300. This leads to openings which expose portions of the trench, including a wall. Thus, when the metal contact material 340 is placed into these openings, the material "falls" into the trench 360. This material 340 then comes in direct contact with the substrate 300 in the walls. The area of contact is designated with dotted line 370 on FIG. 3B. Since the N+ ions are not present in this area 370, as explained above, the direct contact between the metal materials and the p-type substrate shorts the circuit to substrate, rendering the device inoperable.

The problems above are solved and a technological advance achieved in the field by the present invention, which is a method and system for providing a tapered shallow trench isolation structure profile. The present invention will be described in terms of an etching of an interlayer dielectric mask and a silicon substrate of a particular semiconductor device. However, one of ordinary skill in the art will understand that modifications can be made to apply to other types of masks, substrates, and semiconductor devices without departing from the spirit and scope of the present invention.

Figure 4:
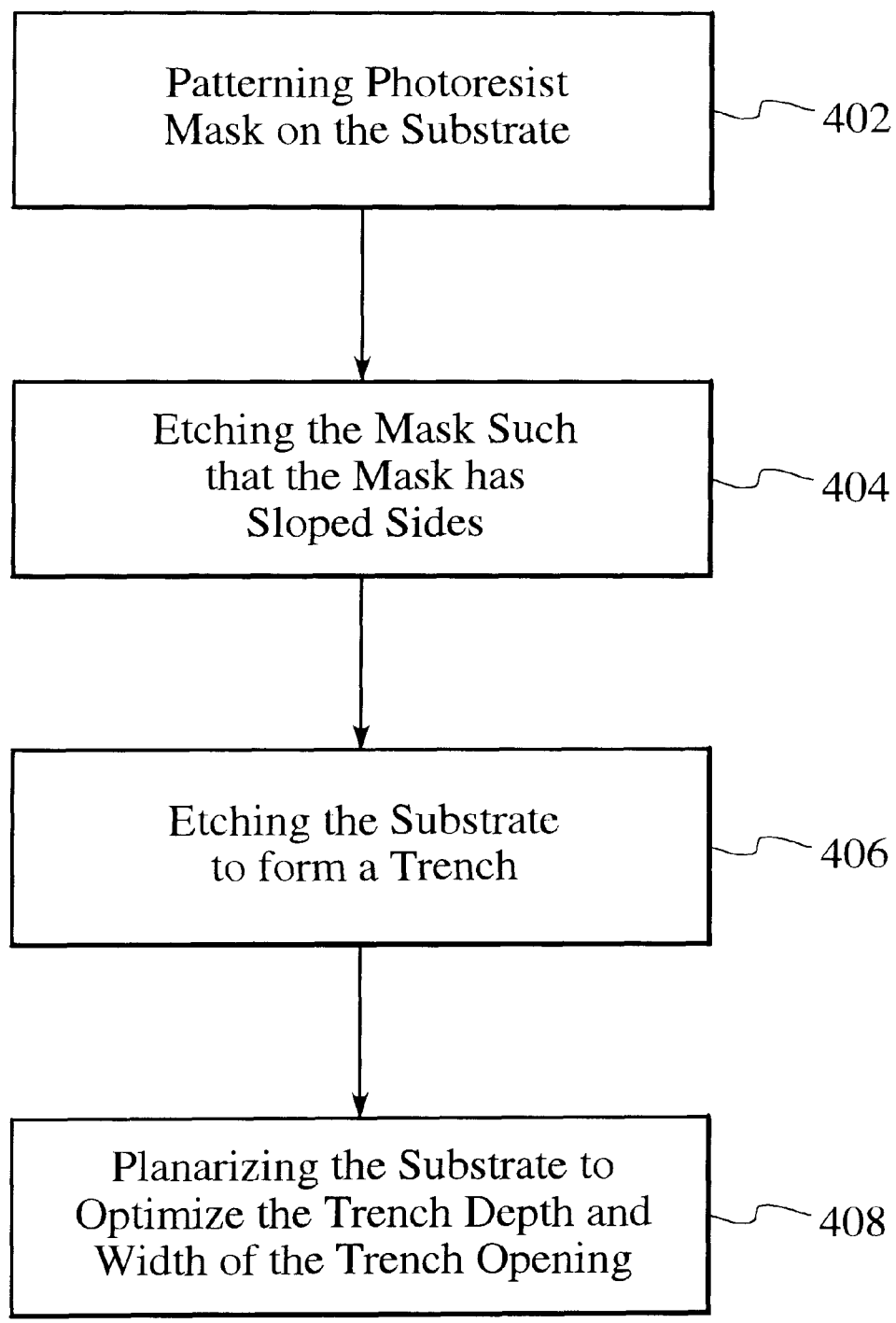
FIG. 4 is a simple flow chart for providing a tapered STI structure profile in accordance with the present invention.

To more particularly illustrate the method and system in accordance with the present invention, refer now to FIG. 4, which is a simple flow chart for providing a tapered STI structure profile in accordance with the present invention. In a method and system in accordance with the present invention, first a photoresist mask is pattered on the silicon substrate via step 402. The mask is etched such that the mask has sloped sides via step 404. Then the silicon substrate is etched to form a trench via step 406. The substrate is then planarized to optimize the trench depth and the width of the trench opening, via step 408. The trench depth is optimized for the connecting layer implant to reach the bottom of the trench. The width of the trench opening determines the width of the source/drain areas of the devices.

Figure 5:
FIG. 5 is a diagram of a photoresist mask patterned on the silicon substrate such that the substrate is exposed wherever a trench is to be formed, in accordance with FIG. 4.
Figure 6:
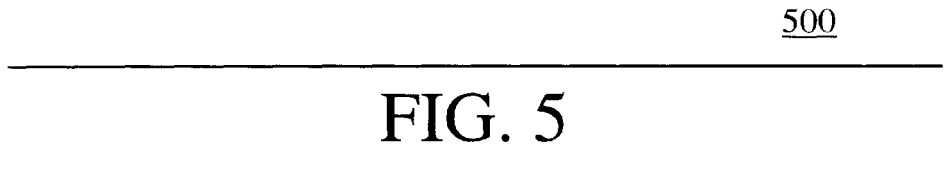
FIG. 6 is a diagram of the etching of the photoresist mask to form sloped sides, in accordance with FIG. 4.
Figure 7:
FIG. 7 is a diagram of the etching of the silicon substrate to form a trench, in accordance with FIG. 4.

To more particularly describe the various features illustrated in FIG. 4, refer now to FIGS. 5–7. FIG. 5 illustrates the patterning of a photoresist mask in accordance with the present invention (step 402 of FIG. 4). FIG. 6 illustrates the etching of the photoresist mask such that the mask has sloped sides, in accordance with the present invention (step 404 of FIG. 4). FIG. 7 illustrates the etching of the silicon substrate to form a trench in accordance with the present invention (step 406 of FIG. 4).

Referring first to FIG. 5, the photoresist mask, 520 of FIG. 5, is patterned on the silicon substrate 500 such that the substrate is exposed wherever a trench is to be formed, via step 402 of FIG. 4. Referring next to FIG. 6, the photoresist mask 520 is then etched to form a mask with sloped sides 620, via step 404 of FIG. 4. In the preferred embodiment in accordance with the present invention, the mask etch can be achieved using conventional etching processes in conjunction with a sputtering process. This combination of processes will cause the upper edges of the resist to etch much faster than the other portions of the resist, thus resulting in the triangular shape of the resist 620. Although the mask etch is disclosed in the context of the preferred embodiment, one of ordinary skill in the art will understand that other means can be used to etch the mask to create sloped sides without departing from the spirit and scope of the present invention. One of ordinary skill in the art will also understand that although the resulting resist is shown to be of a triangular shape in the preferred embodiment, other angles of the slope can be used to form differently shaped resists without departing from the spirit and scope of the present invention.

Figure 8:
FIG. 8 is a diagram of an STI structure profile formed in accordance with the present invention.

Once the photoresist mask 620 is etched to have sloped sides, a substrate etching process to form the trench is performed. FIG. 7 shows the etching of the silicon substrate to form a trench, via step 406 of FIG. 4. The conventional method of etching the silicon substrate to form an STI structure profile is applied. The dotted lines show the shape of the photoresist mask 620 when the substrate etch starts. The solid lines show the shape of the photoresist mask 720 after the substrate etch ends. As the substrate 500 is etched, the bottom corners of the photoresist mask 620, located in the rectangular area 730, as well as the top of the mask, is eroded. The erosion at 730 causes the sides of the mask 620 to recede as the etch progresses. This pulls the angle of the walls of the trench 740 back as well, resulting in tapered walls rather than perpendicular walls. The resulting STI structure profile from the method in accordance with the present invention, as described above, is a tapered shallow trench isolation structure profile. FIG. 8 shows such a trench profile 820 after the photoresist 720 is removed. The substrate may then be polished, using for example the CMP process, to optimize the depth and the width of the trench opening for subsequent processes. Conventional semiconductor processes may then be performed with this profile.

Figure 9A:
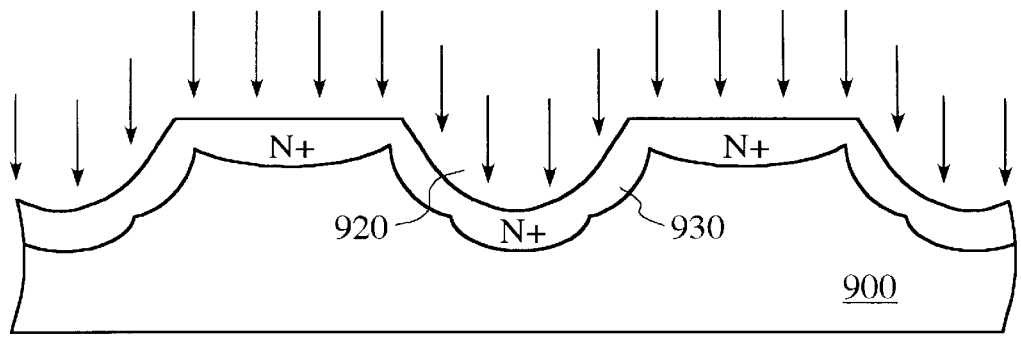
FIG. 9A is a diagram of a connecting layer implantation with an STI structure profile in accordance with the present invention.
Figure 9B:
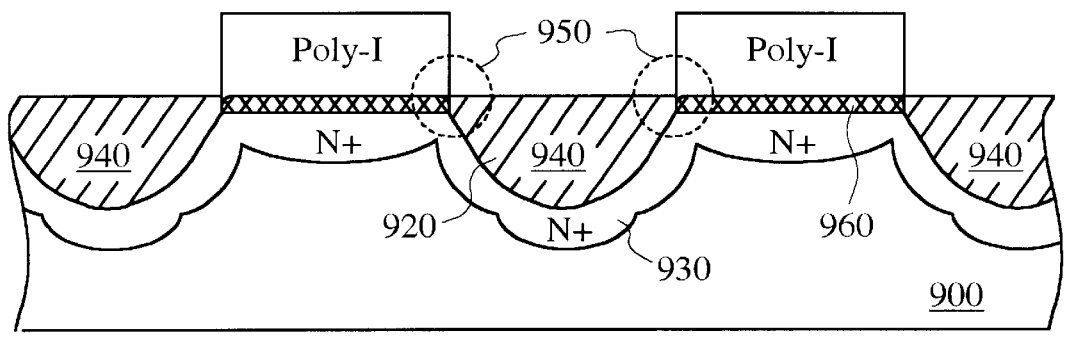
FIG. 9B is a diagram of the active areas at the upper corners of the trench with an STI structure profile in accordance with the present invention.
Figure 9C:
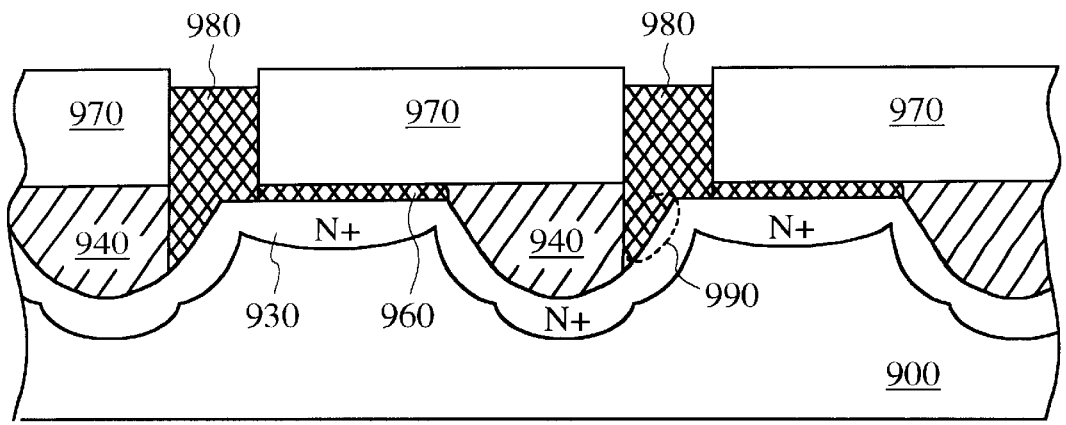
FIG. 9C is a diagram of a misalignment of the mask during the metal contact formation process with an STI structure profile in accordance with the present invention.

FIGS. 9A–9C illustrate how the tapered shallow trench isolation structure profile solves the problems described above. FIG. 9A illustrates the implantation of the connecting layer (N+ ions) with an STI structure profile in accordance with the present invention. Because the walls of the trench is no longer nearly perpendicular, like the direction of the implant, the N+ ions are able to implant into the walls of the trench 920. Thus, no gaps in the connecting layer 930 occur from the implantation. The desired continuous connecting layer 930 in the substrate 900 is accomplished. The metal contacts which are formed later will be properly connected.

FIG. 9B illustrates the active areas at the upper corners of the trench with an STI structure profile in accordance with the present invention. Because the profile is tapered, the edge of the trench does not abruptly drop off. The tunnel oxide 960 at the upper corners 950 of the trench thus does not recede or thin during processing of the device. Therefore, the tunnel oxide's 960 integrity is maintained. If the device in FIG. 9B is a FLASH EEPROM device, the erasure and programming of the device can be accomplished at the tunnel oxide edges with reliability.

FIG. 9C illustrates the misalignment of the ILD mask 970 during formation of metal contacts 980 with an STI structure profile in accordance with the present invention. When a misalignment occurs, the tapered walls of the trench come in contact with the contact material 980. However, unlike the situation where the walls are nearly perpendicular, the contact material 980 does not touch the substrate 900 directly at its exposed areas 990. Instead, it contacts the connecting layer 930 that was implanted earlier via the process illustrated in FIG. 9A. Thus, instead of shorting to substrate, connectivity between metals contacts 980 are maintained.

A method and system for providing a tapered shallow trench isolation profile has been disclosed. Although the present invention has been described in accordance with the embodiment shown, one of ordinary skill in the art will readily recognize that there could be variations to the embodiment and those variations would be within the spirit and scope of the present invention. Accordingly, many modifications may be made by one of ordinary skill in the art without departing from the spirit and scope of the appended claims.

What is claimed is:

1. A method for providing a shallow trench isolation structure profile on a semiconductor, the isolation structure profile including a semiconductor substrate, comprising the steps of:

a) patterning a mask on the semiconductor substrate;

b) etching the mask such that the mask has sloped sides;

c) etching the semiconductor substrate to form a trench, the mask with sloped sides causing the trench to have tapered sides; and d) planarizing the semiconductor substrate.

2. A method in claim 1, wherein the semiconductor substrate is silicon.

3. A method in claim 1, wherein the mask is a photoresist mask.

4. A method in claim 3, wherein the photoresist mask is patterned to expose a plurality of areas in the substrate where a plurality of trenches are to be formed.

5. A method in claim 3, wherein the photoresist mask is etched using a conventional etching process in conjunction with the conventional sputtering process whereby the upper edges of the photoresist mask etches faster than the remaining portions of the photoresist mask.

6. A method in claim 5, wherein the photoresist mask is etched into a triangular shape.

7. A method in claim 1, wherein the planarizing step (d) comprises of a chemical-mechanical process such that the planarization optimizes the trench depth and the width of the trench opening for subsequent processes.

8. A method for providing a shallow trench isolation structure profile on a semiconductor, the isolation structure profile including a semiconductor substrate, comprising the steps of:

(1) patterning a mask on the semiconductor substrate to expose an area in the substrate where a trench is to be formed;

(2) etching the mask such that the mask has a triangular shape;

(3) etching the semiconductor substrate to form a trench, the triangular shaped mask causing the trench to have tapered sides; and (4) planarizing the semiconductor substrate such that the trench depth and the width of the trench opening are optimized for subsequent processes.

9. The method in claim 8, wherein the semiconductor substrate is silicon.

10. The method in claim 9, wherein the mask is a photoresist mask.

11. A method in claim 8, wherein the planarizing step (4) comprises of a chemical-mechanical process.

12. A method for providing a shallow trench isolation structure profile on a flash semiconductor device, the isolation structure profile including a semiconductor substrate, comprising the steps of:

a) patterning a mask on the semiconductor substrate to expose an area in the substrate where a shallow trench isolation structure is to be formed;

b) etching a mask such that the mask has a triangular shape, using a conventional etching process in conjunction with the conventional sputtering process whereby the upper edges of the photoresist mask etches faster than the remaining portions of the photoresist mask;

c) etching the semiconductor substrate to form a shallow trench isolation structure profile whereby the triangular shaped mask causes the profile to have tapered sides; and d) planarizing the semiconductor substrate such that the trench depth and the width of the trench opening is optimized.

* * * * *